United States Patent
Xu et al.

(10) Patent No.: US 9,054,111 B2
(45) Date of Patent: Jun. 9, 2015

(54) ELECTRONIC DEVICE AND METHOD OF PACKAGING AN ELECTRONIC DEVICE

(75) Inventors: Jianwen Xu, Chandler, AZ (US); Lizabeth Ann A. Keser, Chandler, AZ (US); Goerge R. Leal, Cedar Park, TX (US); Betty H. Yeung, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 1117 days.

(21) Appl. No.: 12/419,708

(22) Filed: Apr. 7, 2009

(65) Prior Publication Data

US 2010/0252919 A1    Oct. 7, 2010

(51) Int. Cl.
| | |
|---|---|
| *H01L 23/495* | (2006.01) |
| *H01L 23/538* | (2006.01) |
| *H01L 23/31* | (2006.01) |
| *H01L 23/498* | (2006.01) |
| *H01L 23/00* | (2006.01) |

(52) U.S. Cl.
CPC ........ *H01L 23/5389* (2013.01); *H01L 23/3107* (2013.01); *H01L 23/3135* (2013.01); *H01L 23/49822* (2013.01); *H01L 23/562* (2013.01); *H01L 24/00* (2013.01); *H01L 24/19* (2013.01); *H01L 24/97* (2013.01); *H01L 2224/04105* (2013.01); *H01L 2224/20* (2013.01); *H01L 2224/97* (2013.01); *H01L 2924/01029* (2013.01); *H01L 2924/01046* (2013.01); *H01L 2924/01047* (2013.01); *H01L 2924/01077* (2013.01); *H01L 2924/01078* (2013.01); *H01L 2924/01079* (2013.01); *H01L 2924/01082* (2013.01); *H01L 2924/3025* (2013.01); *H01L 2924/3511* (2013.01); *H01L 2924/01005* (2013.01); *H01L 2924/01006* (2013.01); *H01L 2924/01033* (2013.01); *H01L 2924/01076* (2013.01)

(58) Field of Classification Search
CPC ......... H01L 24/94; H01L 24/95; H01L 24/96; H01L 24/97; H01L 24/93; H01L 23/5389; H01L 23/49822; H01L 23/562; H01L 23/3107; H01L 23/3135; H01L 24/19; H01L 24/00
USPC ......... 257/295–296, 417, 419, 426, 635–637, 257/E21.663, E21.664, E23.194; 438/14–15, 457, 464, 795, 492, 503, 438/683, 455, 458–459, 791
See application file for complete search history.

(56) References Cited

U.S. PATENT DOCUMENTS

| | | |
|---|---|---|
| 4,620,986 A | 11/1986 | Yau et al. |
| 4,918,811 A | 4/1990 | Eichelberger et al. |
| 5,144,747 A | 9/1992 | Eichelberger |

(Continued)

FOREIGN PATENT DOCUMENTS

WO    0233751 A2    4/2002

*Primary Examiner* — Ermias Woldegeorgis (57) ABSTRACT

An electronic device can include a package device structure including a die encapsulated within a packaging material. The package device structure can have a first side and a second side opposite the first side. The electronic device can include a first layer along the first side of the package device structure. The first layer can be capable of causing a first deformation of the package device structure. The electronic device can also include a second layer along the second side of the package device structure. The second layer can be capable of causing a second deformation of the package device structure, the second deformation opposite the first deformation.

25 Claims, 7 Drawing Sheets

(56) References Cited

U.S. PATENT DOCUMENTS

| | | |
|---|---|---|
| 5,250,843 A | 10/1993 | Eichelberger |
| 5,866,952 A | 2/1999 | Wojnarowski et al. |
| 6,159,767 A | 12/2000 | Eichelberger |
| 6,232,650 B1* | 5/2001 | Fujisawa et al. ............... 257/666 |
| 6,338,980 B1* | 1/2002 | Satoh ............................ 438/106 |
| 2003/0162368 A1* | 8/2003 | Connell et al. ................. 438/465 |
| 2004/0124452 A1* | 7/2004 | Wellhausen et al. ........... 257/295 |
| 2006/0220261 A1* | 10/2006 | Egawa ........................... 257/778 |
| 2007/0273046 A1* | 11/2007 | Theuss ........................... 257/783 |
| 2009/0075428 A1* | 3/2009 | Tang et al. ..................... 438/114 |
| 2009/0108440 A1* | 4/2009 | Meyer et al. ................... 257/723 |
| 2010/0167471 A1* | 7/2010 | Jin et al. ........................ 438/127 |

\* cited by examiner

ELECTRONIC DEVICE AND METHOD OF PACKAGING AN ELECTRONIC DEVICE

FIELD OF THE DISCLOSURE

The present disclosure generally relates to electronic devices and methods of packaging electronic devices.

BACKGROUND

Semiconductor chips and other dies are packaged in housings that can be coupled to a printed circuit board. Packaging can be accomplished using particular technologies, such as wire bonding, flip chip packaging, chip-first packaging, or other techniques. Often, many dies are packaged simultaneously to produce a packaging panel. The packaging panel is divided, or singulated, into individual devices that each contain a die.

Figure 1:
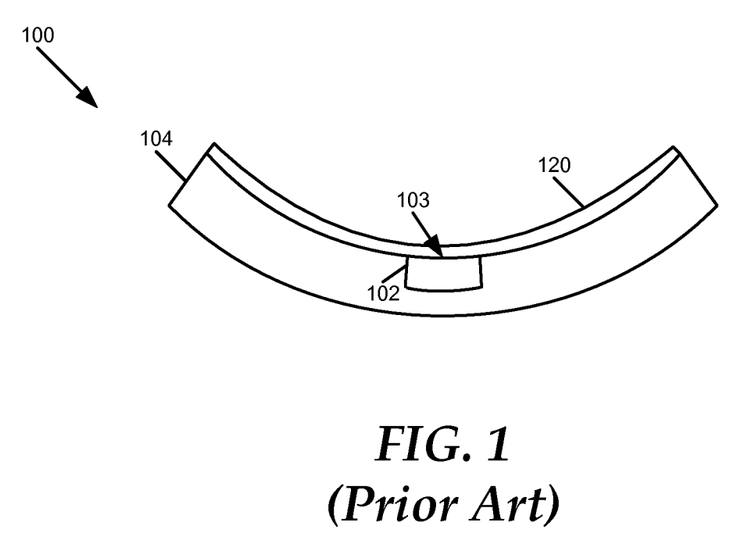
FIG. 1 illustrates a prior art electronic device after a buildup layer is formed.

As illustrated in FIG. 1, a buildup layer 120 can be formed along a side of the electronic device 100 that includes an active portion 103 of a die 102. Formation of the buildup layer 120 can cause deformation of the electronic device 100, such as a concave deformation, which can be produced by a compressive stress caused by the different materials of the buildup layer 120 and the packaging material 104 coming into contact with each other.

Deformation of the electronic device 100 can affect processibility, yield and reliability. For instance, deformation of a packaging panel that includes a plurality of electronic devices can lead to movement of the packaging panel during singulation. As the packaging panel is separated into individual electronic devices, the panel may move, causing a saw or another suitable singulation device to damage the die 102 or produce undesirable cuts in the packaging material 104.

BRIEF DESCRIPTION OF THE DRAWINGS

It will be appreciated that for simplicity and clarity of illustration, elements illustrated in the Figures have not necessarily been drawn to scale. For example, the dimensions, angles and curvatures of some of the elements may be exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF THE DRAWINGS

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily limit any of the various claimed inventions. Moreover, some statements may apply to some inventive features but not to others.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single device is described herein, more than one device may be used in place of a single device. Similarly, where more than one device is described herein, a single device may be substituted for that one device.

Unless otherwise defined, all technical and scientific terms used herein have the same meaning as commonly understood by one of ordinary skill in the art to which this disclosure belongs. Although methods and materials similar or equivalent to those described herein can be used in the practice or testing of embodiments of the present disclosure, suitable methods and materials are described below.

Figure 2:
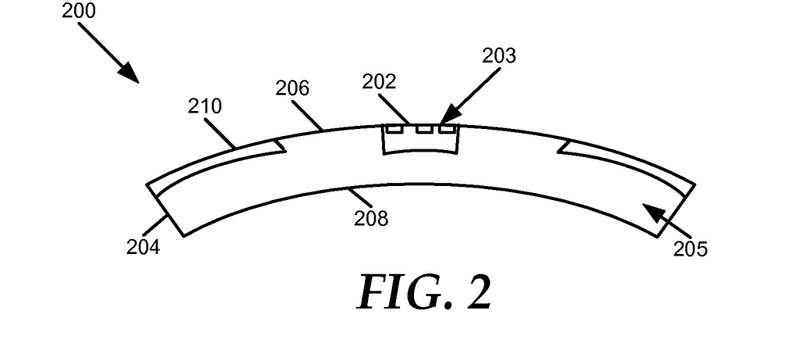
FIGS. 2-4 are diagrams illustrating a particular embodiment of an electronic device in accordance with the current disclosure before and after a buildup layer is formed.
Figure 3:
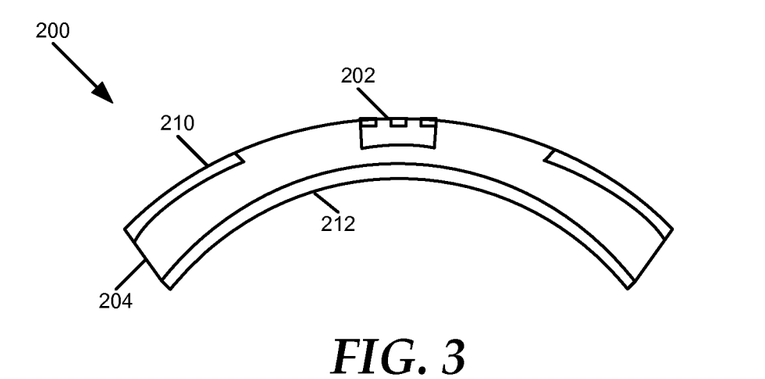
Figure 4:
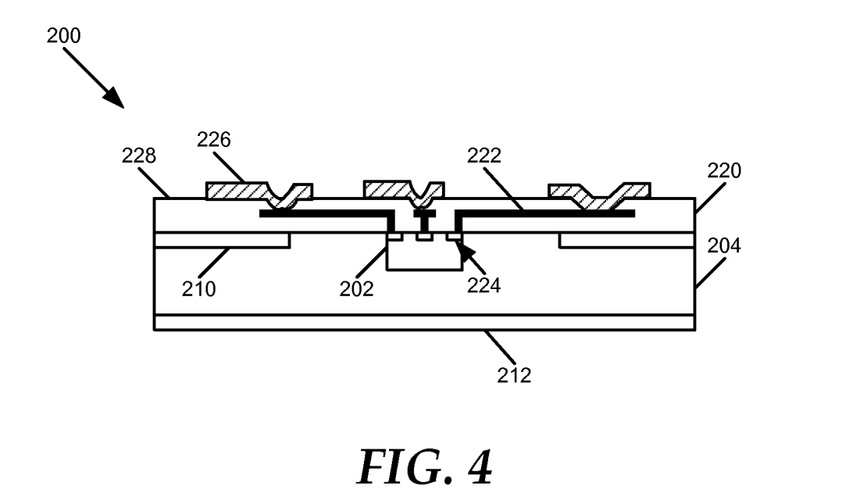

FIGS. 2-4 illustrate a particular embodiment of an electronic device 200. The electronic device 200 includes a package device structure 204 including a die 202, such as a semiconductor chip or another suitable microchip. The die 202 is encapsulated within a packaging material 205. The package device structure 204 has a side 206 corresponding to an active portion 203 of the die 202. The package device structure 204 also has another side 208 opposite the active portion 203 of the die 202. The electronic device 200 can also include an embedded grounding plane (EGP) 210 that is adapted to electrically ground the package device structure 204, to shield the die 202 from electromagnetic interference, to prevent shifting of the die 202 during encapsulation, or any combination thereof.

In one example, the die 202 can be encapsulated during a panelization process in which multiple dies are encapsulated by the packaging material 205, forming a packaging panel. The packaging material 205 can include an organic material, such as an epoxy. Further, the packaging material 205 can include an inorganic filler material, such as talc, silica, alumina, another suitable inorganic filler, or any combination thereof.

As illustrated in FIG. 2, the package device structure 204 may deform, potentially resulting in a convex deformation. The convex deformation has been exaggerated in FIG. 2, for ease of illustration and description. In one example, the deformation can be induced by a tensile stress applied to the package device structure 204, where the tensile stress is caused by the panelization process or another suitable encapsulation process. After encapsulation, a layer 212 can be applied to the side 208 of the package device structure 204 that is opposite the active portion 203 of the die 202. The layer 212 is adapted to increase convex deformation of the package device structure 204, as illustrated in FIG. 3, such that a total convex deformation of the electronic device 200 resulting from encapsulation and application of the layer 212 will counter an opposite deformation, such as a concave deformation, caused by a subsequently-formed buildup layer 220 contacting the packaging material 205 on the side 206 of the package device structure 204 that corresponds to the active portion 203 of the die 202.

In a particular embodiment, the layer 212 can include a polymer film material. For example, the polymer film material can include a dry film material, such as a B-stage polymer or another suitable intermediate stage polymer or resin that can be cured to a highly-crosslinked stage after it is applied to the package device structure 204. Such dry films can be cured using ultraviolet radiation, heat, another suitable curing method, or any combination thereof. In one embodiment, the dry film can include a polymer with an inorganic filler, such as silica. In another embodiment, the dry film can include a polymer film having a woven fiber network, such as fiberglass in between layers of epoxy. The thickness of the layer 212 can be from approximately 5 microns to approximately 150 µm, such as approximately 10 µm to approximately 100 µm.

A coefficient of thermal expansion (CTE) of the layer 212 can be within a range of from approximately 10 ppm/C to approximately 150 ppm/C, such as within a range of from approximately 15 ppm/C to approximately 100 ppm/C. The CTE of the packaging material 205 can be within a range of from approximately 5 ppm/C to approximately 25 ppm/C, such as within a range of from approximately 7 ppm/C to approximately 20 ppm/C. In an illustrative, non-limiting embodiment, the CTE of the layer 212 can be within approximately 50% of a CTE of the packaging material 205. For example, the CTE of the packaging material 205 can be approximately 20 ppm/C, and the CTE of the layer 212 can be within a range of from approximately 10 ppm/C to approximately 30 ppm/C.

The thickness, materials properties, and composition of the layer 212 can be varied in order to obtain a desired degree of convex deformation that is opposite to and counters at least a portion of concave deformation resulting from the formation of the buildup layer 220. In a particular embodiment, the concave deformation caused by formation of the buildup layer 220 can be predicted using computer simulation (e.g., Finite Element Method (FEM) simulation) or another suitable prediction method prior to application of the layer 212. The material of the layer 212 can be selected, and its thickness determined, based on a compressive stress or other stress that the buildup layer 220 is predicted to cause.

In an illustrative embodiment, the buildup layer 220 can include an insulating film containing a dielectric material. In one example, the insulating film can include an organic dielectric material, such as a polymeric dielectric material. For instance, the insulating film can include benzocyclobutene (BCB), polyimide, an epoxy photo-dielectric material, another organic dielectric material, or the like. Those skilled in the art will recognize that other suitable dielectric materials may be used. In one embodiment, the thickness of the insulating film can be within a range of from approximately 2 µm to approximately 50 µm. Thicknesses smaller or larger than those recited can be used.

As illustrated in FIG. 4, the buildup layer 220 includes conductive structures 222 adapted to electrically connect pads 224 on the active side 203 of the die 202 with bond pads 226 on the buildup layer 220. In one embodiment, a bond pad 226 can extend partially through the buildup layer 220 from a top side 228 of the buildup layer 220. The bond pads 226 can be electrically connected, via an electrical interconnect (not shown) of the buildup layer, with other bond pads that are coupled to another die (not shown) 220 via other conductive structures. Input/output signals of the die 202 can be sent via the electrical interconnect of the buildup layer 220 to the other die, another device, or any combination thereof. In one embodiment, the conductive structures 222 and the bond pads 226 can include copper, nickel, a noble metal (gold, silver, platinum, palladium, osmium, or iridium), or another suitable conductor.

Figure 9:
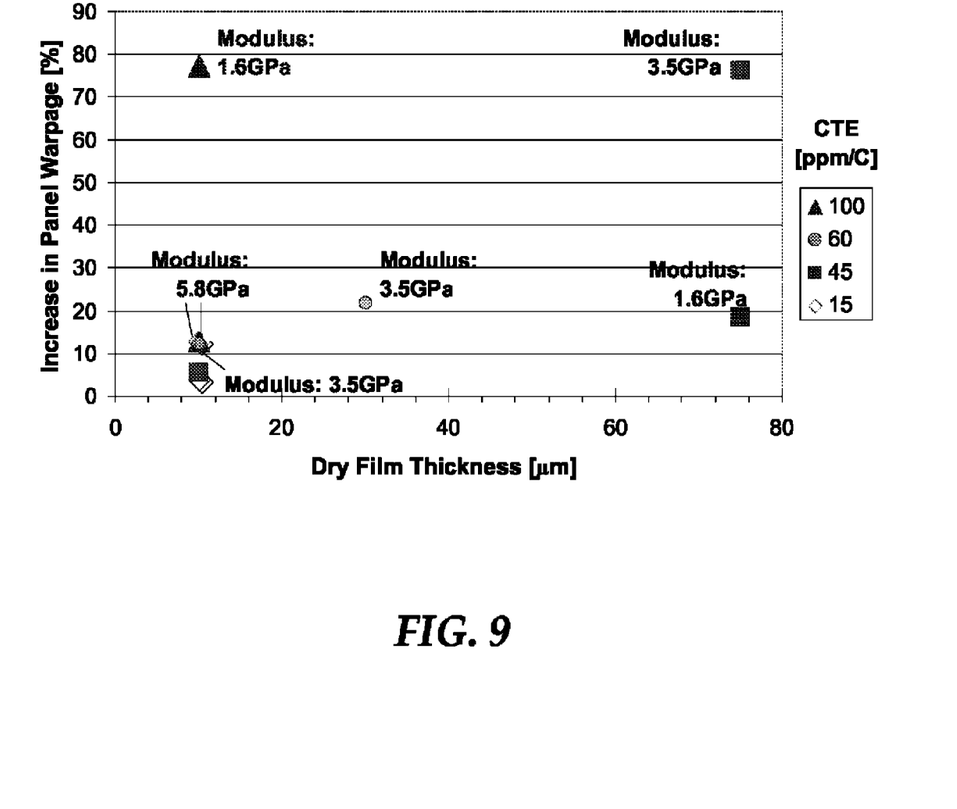
FIG. 9 is a graph illustrating variations in packaging panel warpage due to changes in properties of particular dry film materials.

Buildup layers of varying thicknesses can be used for electronic devices, such as the electronic device 200. Thicker buildup layers can induce greater stresses when contacting the packaging material 205. Variations in stress caused by the thickness of the buildup layer 220 can be countered by varying a thickness of the layer 212; by using a material for the layer 212 that has a higher or lower Young's modulus; by using a material for the layer 212 having a higher or lower CTE; or any combination thereof. Examples of thickness, CTE and Young's modulus in relation to increases in absolute warpage are illustrated in FIG. 9. For example, the absolute convex warpage of a packaging panel can be increased up to 80% by using a thin (e.g., less than 20 µm), high CTE (e.g., greater than 90 ppm/C) material having a low modulus (e.g., less than 2 GPa); or by using a thick (e.g., greater than 65 µm), low CTE (e.g., less than 50 ppm/C) film having a high modulus (e.g., greater than 3 GPa).

The layer 212 can be applied prior to formation of the buildup layer 220. In another embodiment (not illustrated), the layer 212 can be applied after formation of the buildup layer 220. In this other embodiment, actual concave deformation caused by the buildup layer 220 can be measured, and thickness, materials properties and composition of the layer 212 can be selected based on such measurement. The layer 212 can melt, adhere, cure, or any combination thereof, onto the package device structure 204 using lamination or another suitable process. In one embodiment, an external pressure can be applied to the layer 212 during lamination or another suitable process, forcing the layer 212 toward the second side 208 of the package device structure 204. In another embodiment, the layer 212 can be forced toward the second side of the package device structure 204 during heating using a vacuum laminator. In another embodiment (not shown), an adhesive can be disposed between the layer 212 and the package device structure 204. The adhesive can include, for example, an epoxy, an acrylate, polyurethane, another hydrocarbon, another suitable adhesive, or any combination thereof.

Application of the layer 212 to the package device structure 204 can counter stress caused by contact between the dissimilar materials of the buildup layer 220 and the packaging material 205, such that there is substantially no deformation of the package device structure 204 after formation of the buildup layer 220, as illustrated in FIG. 4. In another embodiment, application of the layer 212 can counter stress caused by formation of the buildup layer 220, such that the package device structure 204 exhibits a maximum deformation of less than approximately 1 mm per 100 mm of the package device structure 204 after formation of the buildup layer 220.

Those skilled in the art will recognize that convex and concave deformations are used for ease of explanation. Where formation of a buildup layer results in convex deformation, a dry film suitable to cause a concave deformation can be used to counter the convex deformation, and in a particular embodiment, result in a substantially flat packaging panel or other package device structure.

Figure 5:
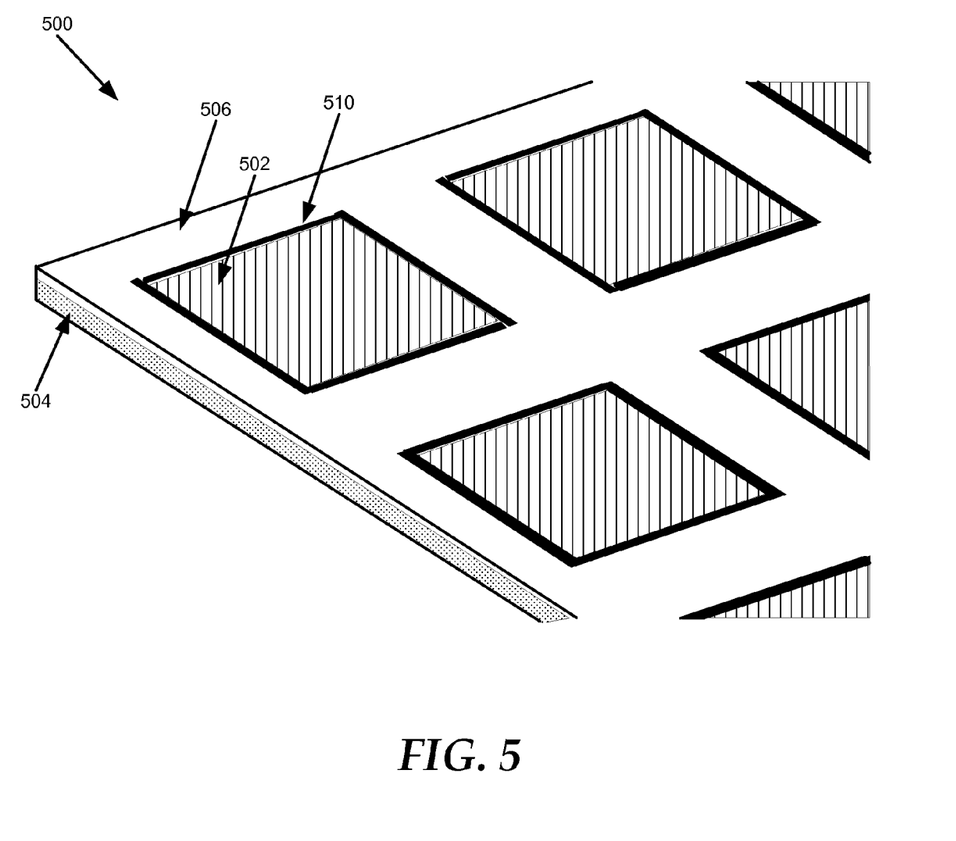
FIG. 5 is a diagram illustrating a partial view of a particular embodiment of an electronic device packaging panel.

FIG. 5 illustrates a particular embodiment of a packaging panel 500. The packaging panel 500 includes a plurality of dies 502 encapsulated in a packaging material 504. The die 502 may be substantially surrounded by an embedded ground plane (EGP) 506 that includes copper or another suitable conductive material. In an illustrative embodiment, the electronic device packaging panel 500 can include an EGP-die spacing 510. For instance, a space of approximately 0.25 mm or another suitable dimension can be disposed between the EGP 506 and the die 502.

In an illustrative embodiment, the packaging panel 500 can have a width (or a diameter for substantially circular packaging panels) within a range of from approximately 100 mm to approximately 450 mm, such as approximately 300 mm. The packaging panel 500 can have a thickness within a range of from approximately 0.2 mm to approximately 2 mm, such as approximately 0.6 mm. The EGP 506 can have a thickness within a range of from approximately 0.05 mm thick to approximately 1 mm thick, such as a nominal thickness of 0.125 mm. The die 502 can have a length within a range of from approximately 1 mm to approximately 20 mm, such as approximately 5.8 mm. The die 502 can have a width within a range of from approximately 1 mm to approximately 20 mm, such as approximately 5.4 mm.

Figure 6:
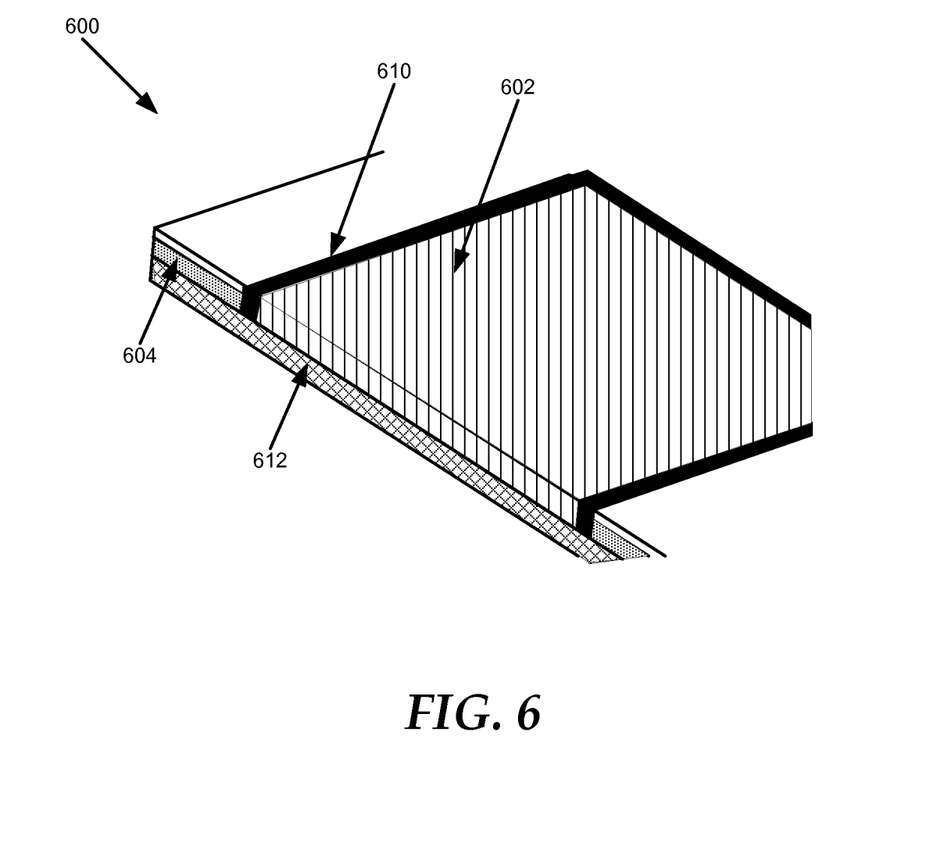
FIG. 6 is a diagram illustrating a perspective view of a portion of an electronic device packaging panel.

FIG. 6 illustrates a perspective view of a packaging panel 600, such as the packaging panel 500 illustrated in FIG. 5, after layer 612 is applied. The packaging panel 600 includes a die 602 encapsulated in a packaging material 604. The layer 612 is applied to a side of the packaging panel 600 that is opposite an active portion of the die 602. The layer 612 is adapted to induce a stress on the packaging panel 600 that is opposite to and that at least partially counters a stress induced on the packaging panel 600 by a buildup layer, such as the buildup layer 220 in FIG. 4. The layer 612 causes a deformation that is opposite to and that at least partially counters deformation of the packaging panel 600 due to the buildup layer. The layer 612 can include a dry film material, such as a B-stage polymer material. In an illustrative embodiment, the dry film material can have a thickness within a range of from approximately 10 μm to approximately 100 μm, such as approximately 30 μm. In one embodiment, the buildup layer and the layer 612 can be substantially continuous along more than half of the packaging panel 600, such as at least approximately 80% of the packaging panel 600.

Figure 7:
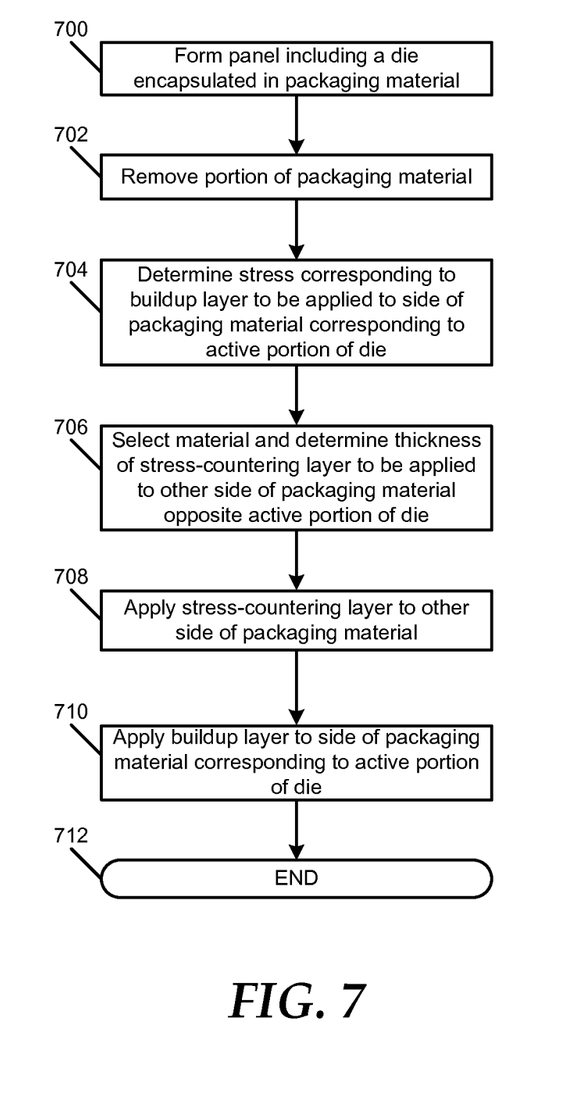
FIG. 7 is a flow diagram illustrating a particular embodiment of a method of packaging an electronic device.

FIG. 7 illustrates a particular embodiment of a method of packaging an electronic device. At block 700, a packaging panel is formed including a die encapsulated within a packaging material. Moving to block 702, a portion of the packaging material is removed. For instance, packaging material on the other side of the packaging panel that is opposite the active portion of the die can be ground to a substantially smooth surface suitable for applying a polymer film to the packaging panel. In one embodiment, a thickness of the packaging material can be within a range of approximately 0.2 mm to approximately 2 mm, such as less than or equal to approximately 0.6 mm, after the portion of the packaging material is removed.

Proceeding to block 704, in a particular embodiment, a stress corresponding to a buildup layer can be determined. The buildup layer is to be applied to a side of the packaging material that corresponds to an active portion of the die. Determination of the stress can include determining a stress type, such as tensile or compressive; a stress amount; an expected deformation amount and direction, such as 5 mm concave per 100 mm of a packaging panel; or any combination thereof. In an illustrative embodiment, the stress can be determined using a computer simulation.

Continuing to block 706, in a particular embodiment, a material can be selected for a stress-countering layer to be applied to the other side of the packaging panel that is opposite the active side of the die. A thickness of the stress-countering layer can also be determined. In one embodiment, the stress-countering layer can be a dry film or another suitable polymer film adapted to increase deformation of the packaging panel, such that a total deformation of the packaging panel resulting from encapsulation and application of the stress-countering layer is opposite to and counters another deformation caused by formation of the buildup layer. The material, thickness, or any combination thereof, of the stress-countering layer can be dependent on the stress determined at block 704.

Advancing to block 708, the stress-countering layer is applied to the other side of the packaging panel that is opposite the active portion of the die. At block 710, the buildup layer is formed on the side of the packaging panel corresponding to the active portion of the die. The method terminates at 712.

Figure 8:
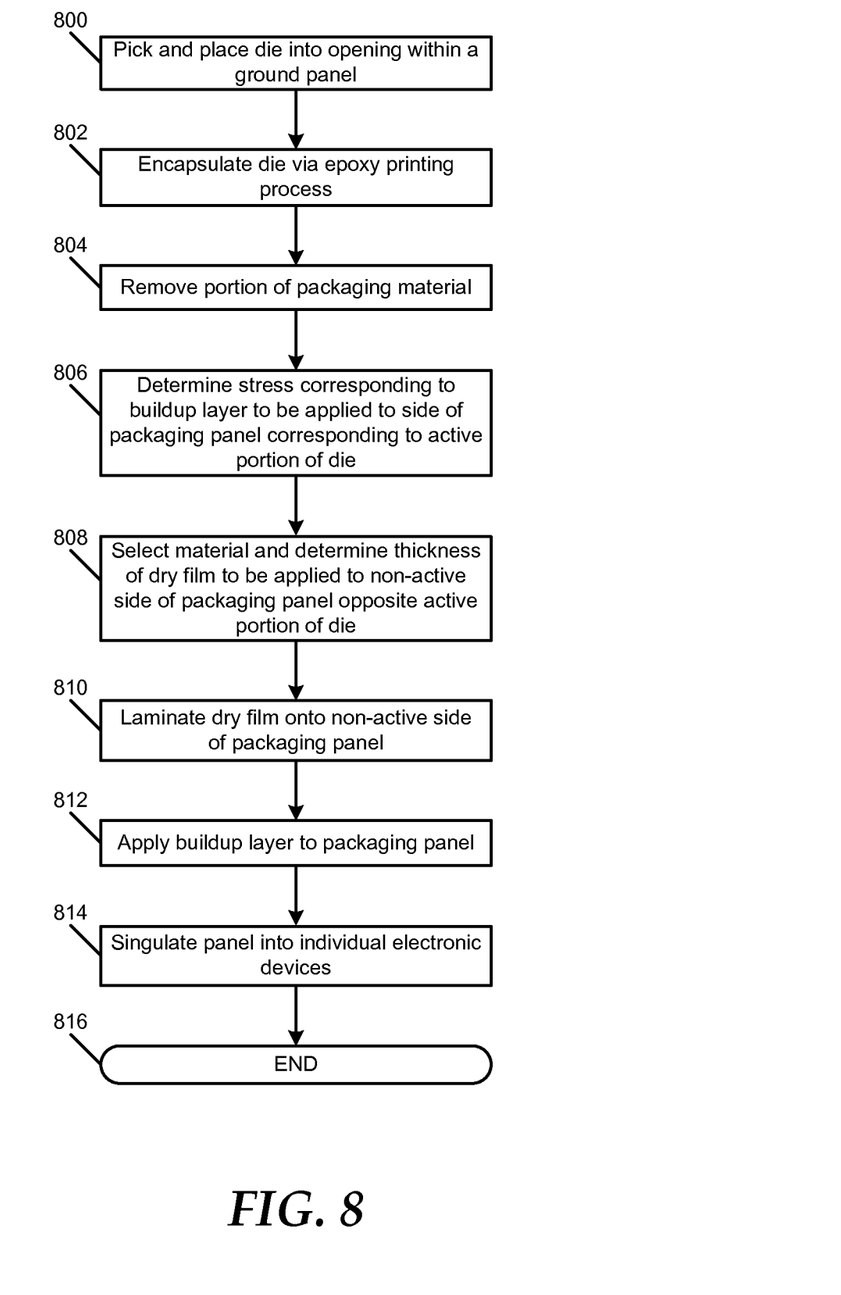
FIG. 8 is a flow diagram illustrating another particular embodiment of a method of packaging an electronic device.

FIG. 8 illustrates a particular embodiment of a method of packaging an electronic device. At block 800, a die is picked and placed into an opening within a ground panel. Moving to block 802, the die is encapsulated within a packaging material using an epoxy printing process. In one embodiment, a plurality of dies can be encapsulated within the packaging material, thereby forming a packaging panel. Proceeding to block 804, a portion of the packaging material is removed. For instance, the other side of the packaging panel that is opposite the active portion of the die can be ground to a substantially smooth surface suitable for applying the dry film to the packaging panel.

Continuing to block 806, in a particular embodiment, a stress corresponding to a buildup layer can be determined. The buildup layer is to be applied to a side of the packaging material that corresponds to an active portion of the die. Advancing to block 808, in a particular embodiment, a material can be selected for a dry film to be applied to the other side of the packaging panel that is opposite the active portion of the die. A thickness of the dry film can also be determined.

At block 810, the dry film is laminated onto the other side of the packaging panel that is opposite the active portion of the die. For instance, the dry film can be applied using a vacuum lamination process. Moving to block 812, the buildup layer is formed on the side of the packaging panel corresponding to the active portion of the die. The buildup layer includes a plurality of electrically conductive structures, each electrically conductive structure being electrically coupled to a die. In an illustrative embodiment, the a plurality of electrically conductive bond pads can be formed on the buildup layer, where each electrically conductive bond pad is electrically coupled to an electrically conductive structure of the plurality of electrically conductive structures. Proceeding to block 814, the packaging panel is singulated using a saw or another suitable singulation method into a plurality of electronic devices, each of which includes a die. The method terminates at 816.

In some embodiments, the methods disclosed herein can be performed substantially as described. In other embodiments, aspects of the methods can be performed in alternative sequences or simultaneously. For instance, the buildup layer can be applied prior to the stress-countering layer, and the resulting stress applied to the electronic device can be determined through measurement rather than calculation or simulation.

Many different aspects and embodiments are possible. Some of those aspects and embodiments are described below. After reading this specification, skilled artisans will appreciate that those aspects and embodiments are only illustrative and do not limit the scope of the present invention.

According to a first aspect, an electronic device can include a package device structure including a die encapsulated within a packaging material. The package device structure can have a first side and a second side opposite the first side. The electronic device can include a first layer along the first side of the package device structure. The first layer can be capable of causing a first deformation of the package device structure. The electronic device can also include a second layer along the second side of the package device structure. The second layer can be capable of causing a second deformation of the package device structure, the second deformation opposite the first deformation.

In an embodiment of the first aspect, the first layer includes a plurality of structures. The plurality of structures includes a conductor and an insulating material. In another embodiment of the first aspect, the first layer includes an electrically conductive structure electrically coupled to the die. In a further embodiment of the first aspect, the electronic device includes an electrically conductive bond pad extending partially through the first layer. The electrically conductive bond pad is electrically coupled to the electrically conductive structure. In still another embodiment of the first aspect, the package device structure includes a second die, and the first die is electrically coupled to the second die via an electrical interconnect of the first layer.

In an embodiment of the first aspect, the second layer comprises an organic material. In another embodiment of the first aspect, the second layer comprises a polymer film material, such as a B-stage polymer film material. An adhesive can be disposed between the second layer and the second side of the package device structure. The adhesive can include, for example, an epoxy, an acrylate, polyurethane, another hydrocarbon, another suitable adhesive, or any combination thereof In one example, the adhesive and the packaging material can each include an epoxy.

In an additional embodiment of the first aspect, a coefficient of thermal expansion of the second layer can be within approximately 50% of a coefficient of thermal expansion of the packaging material.

According to a second aspect, a method of packaging an electronic device can include forming a panel, the panel including a plurality of dies encapsulated within a packaging material. The method can also include forming a first layer along a first side of the panel, thereby inducing a first stress type on the panel. The method can also include attaching a second layer along a second side of the panel, the second layer inducing a second stress type on the panel. In a finished form, the first side can be opposite the second side, and the first stress type can be capable of causing a deformation of the panel that is opposite to a deformation capable of being caused by the second stress type. The method can also include singulating the panel into a plurality of package device structures, each of the plurality of package device structures including a die of the plurality of dies.

In an embodiment of the second aspect, the second layer has a thickness that is partially dependent on the first stress. In another embodiment of the second aspect, the second layer comprises a material that is partially dependent on the first stress.

In a further embodiment of the second aspect, the method includes removing a portion of the packaging material from the panel before attaching the second layer. For instance, a thickness of the packaging material can be at most approximately 0.6 mm after the portion of the packaging material is removed.

In an additional embodiment of the second aspect, attaching the second layer includes melting the second layer, adhering the second layer to the panel, curing the second layer, or any combination thereof.

In another embodiment of the second aspect, the method can include applying an external pressure to the second layer during heating, the external pressure forcing the second layer toward the second side of the panel. In an alternative embodiment, the method can include forcing the second layer toward the second side of the panel during heating using a vacuum laminator.

In a further embodiment of the second aspect, the first layer includes a plurality of electrically conductive structures, each electrically conductive structure electrically coupled to a die of the plurality of dies. In this embodiment, the method can also include forming a plurality of electrically conductive bond pads on the first layer, where each electrically conductive bond pad is electrically coupled to an electrically conductive structure of the plurality of electrically conductive structures.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Many other embodiments may be apparent to those of skill in the art upon reviewing the disclosure. Other embodiments may be used and derived from the disclosure, such that a structural substitution, logical substitution, or another change may be made without departing from the scope of the disclosure. Accordingly, the disclosure is to be regarded as illustrative rather than restrictive.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic device comprising:
a package device structure including a singulated die encapsulated on at least three sides within a packaging material, the package device structure having a first side and a second side opposite the first side;

a first layer along the first side of the package device structure and distinct from the singulated die, the first layer causing a first deformation of the package device structure; and a second layer along the second side of the package device structure and distinct from the singulated die, the second layer causing a second deformation of the package device structure, wherein the second deformation is opposite the first deformation, a thickness of the second layer based upon the first deformation.

2. The electronic device of claim 1, wherein the first layer comprises a plurality of structures, the plurality of structures including a conductor and an insulating material, wherein the conductor includes an electrically conductive structure electrically coupled to the singulated die.

3. The electronic device of claim 2, further comprising an electrically conductive bond pad disposed on the first layer, the electrically conductive bond pad electrically coupled to the electrically conductive structure.

4. The electronic device of claim 2, wherein the package device structure includes a second die, and wherein the first die is electrically coupled to the second die via an electrical interconnect of the first layer.

5. The electronic device of claim 1, wherein the second layer comprises an organic material.

6. The electronic device of claim 5, wherein the second layer comprises a polymer film material.

7. The electronic device of claim 6, wherein the second layer comprises a B-stage polymer film material.

8. The electronic device of claim 1, further comprising an adhesive disposed between the second layer and the second side of the package device structure.

9. The electronic device of claim 8, wherein the adhesive includes an epoxy, an acrylate, polyurethane, a hydrocarbon, or any combination thereof.

10. The electronic device of claim 8, wherein the adhesive and the packaging material each include an epoxy.

11. The electronic device of claim 1, wherein a material of the second film is selected based on the first deformation.

12. The electronic device of claim 1, wherein the package device structure further includes an embedded ground plane encapsulated within the packaging material.

13. The electronic device of claim 1, wherein the second layer has a coefficient of thermal expansion of not greater than 50 ppm/C.

14. The electronic device of claim 1, wherein the second layer has a thickness of less than 20 micrometers and a modulus of less than 2 GPa.

15. The electronic device of claim 1, wherein the electronic device has a deformation of less than 1 mm per 100 mm.

16. A method of packaging an electronic device, the method comprising:

forming a panel, the panel including a plurality of singulated dies segmented from a wafer, the plurality of singulated dies encapsulated within a packaging material;

forming a first layer along a first side of the panel and distinct from the singulated die, thereby inducing a first stress type on the panel;

attaching a second layer along a second side of the panel and distinct from the singulated die, the second layer inducing a second stress type on the panel, wherein, in a finished form, the first side is opposite the second side, and the first stress type causes a deformation of the panel that is opposite to a deformation caused by the second stress type, the second layer having a thickness based on the deformation of the panel; and singulating the panel into a plurality of package device structures following forming the first layer and attaching the second layer, each of the plurality of package device structures including a singulated die of the plurality of singulated dies.

17. The method of claim 16, wherein attaching the second layer comprises melting the second layer, adhering the second layer to the panel, curing the second layer, or any combination thereof.

18. The method of claim 17, further comprising applying an external pressure to the second layer during heating, the external pressure forcing the second layer toward the second side of the panel.

19. The method of claim 17, further comprising forcing the second layer toward the second side of the panel during heating using a vacuum laminator.

20. The method of claim 16, wherein the second layer has a thickness that is partially dependent on the first stress.

21. The method of claim 16, wherein the second layer comprises a material that is partially dependent on the first stress.

22. The method of claim 16, further comprising removing a portion of the packaging material from the panel before attaching the second layer.

23. The method of claim 16, wherein a thickness of the packaging material is at most approximately 0.6 mm after the portion of the packaging material is removed.

24. The method of claim 16, further comprising selecting a material of the second layer based on the deformation of the panel.

25. The method of claim 16, wherein the second layer is attached prior to forming the first layer.

* * * * *